(12) United States Patent
Braun et al.

(10) Patent No.: US 11,776,827 B2
(45) Date of Patent: Oct. 3, 2023

(54) ADAPTER, CONNECTION DEVICE AND SUPPLY SYSTEM

(71) Applicant: SUSS MicroTec Lithography GmbH, Garching (DE)

(72) Inventors: Michael Braun, Garching (DE); Simon Schutzbach, Garching (DE); Kader Mekias, Garching (DE); Dinesh Vijayaraghavan, Garching (DE); Orazio Monteserrato, Garching (DE)

(73) Assignee: SUSS MICROTEC LITHOGRAPHY GMBH

( * ) Notice: Subject to any disclaimer, the term of this patent is extended or adjusted under 35 U.S.C. 154(b) by 101 days.

(21) Appl. No.: 17/388,958

(22) Filed: Jul. 29, 2021

(65) Prior Publication Data

US 2022/0037168 A1 Feb. 3, 2022

(30) Foreign Application Priority Data

Jul. 29, 2020 (NL) ..................................... 2026157

(51) Int. Cl.
*H01L 21/67* (2006.01)
*B05C 11/10* (2006.01)

(52) U.S. Cl.
CPC .......... *H01L 21/6715* (2013.01); *B05C 11/10* (2013.01)

(58) Field of Classification Search
CPC ....................................................... B05C 11/10
USPC ........................................................ 222/564
See application file for complete search history.

(56) References Cited

U.S. PATENT DOCUMENTS

| 888,488 | A | * | 5/1908 | Gurley | ................. | B67D 1/1252 |
| | | | | | | 222/54 |
| 3,382,886 | A | * | 5/1968 | Hesselman | ............. | B05C 11/10 |
| | | | | | | 137/563 |
| 4,027,789 | A | * | 6/1977 | Dickey | ................. | B05B 11/043 |
| | | | | | | 222/211 |
| 4,119,022 | A | * | 10/1978 | Dykes | ................. | B65D 83/306 |
| | | | | | | 222/402.1 |
| 7,025,234 | B2 | * | 4/2006 | Priebe | ................. | B67D 7/0255 |
| | | | | | | 222/400.7 |
| 9,458,002 | B2 | * | 10/2016 | Treichel | .................... | G03F 7/16 |
| 2003/0075566 | A1 | * | 4/2003 | Priebe | ................. | B67D 1/0054 |
| | | | | | | 222/400.7 |
| 2003/0189061 | A1 | * | 10/2003 | Kawai | ................. | B65D 1/0215 |
| | | | | | | 222/400.7 |
| 2005/0087237 | A1 | * | 4/2005 | O'Dougherty | ......... | B67D 7/763 |
| | | | | | | 137/590 |

(Continued)

FOREIGN PATENT DOCUMENTS

| EP | 2017195 A1 * | 1/2009 | ............. B65D 47/06 |
| WO | WO-2012123071 A1 * | 9/2012 | ............. B05C 11/10 |

(Continued)

*Primary Examiner* — Paul R Durand
(74) *Attorney, Agent, or Firm* — HAYES SOLOWAY P.C.

(57) ABSTRACT

An adapter for a liquid container of a supply system of a wet process module for the treatment of substrates has a container part for fastening to the liquid container and a channel part for fastening to the supply system. The container part has a central opening and a fastening device for fastening the container part to the liquid container. The channel part has a continuous first channel portion and a continuous second channel portion, the first and the second channel portion each opening into the central opening of the container part.

16 Claims, 3 Drawing Sheets

(56) References Cited

U.S. PATENT DOCUMENTS

| | | | | |
|---|---|---|---|---|
| 2005/0183774 | A1* | 8/2005 | Kitagawa | B01L 3/523 |
| | | | | 222/66 |
| 2006/0180605 | A1* | 8/2006 | Priebe | B67D 7/0261 |
| | | | | 222/400.7 |
| 2011/0265896 | A1* | 11/2011 | Nakashima | B05B 15/30 |
| | | | | 137/561 R |
| 2012/0187153 | A1* | 7/2012 | Burge | B67D 1/0462 |
| | | | | 141/2 |
| 2013/0327792 | A1* | 12/2013 | Priebe | B67D 1/0054 |
| | | | | 222/400.7 |
| 2015/0293453 | A1* | 10/2015 | Treichel | G03F 7/16 |
| | | | | 141/94 |
| 2018/0111747 | A1* | 4/2018 | Mo | B05B 9/0811 |

FOREIGN PATENT DOCUMENTS

| | | | | |
|---|---|---|---|---|
| WO | WO-2015042109 A1 * | 3/2015 | | B65D 1/12 |
| WO | WO-2016152472 A1 * | 9/2016 | | B05C 11/10 |

* cited by examiner

ADAPTER, CONNECTION DEVICE AND SUPPLY SYSTEM

The invention relates to an adapter for a liquid container of a supply system of a wet process module, in particular a lacquering module, for micro- and nanofabrication for the treatment of substrates, in particular wafers. Furthermore, the invention relates to a connection device and to a supply system of such a wet process module.

BACKGROUND OF THE INVENTION

The exchangeable liquid containers contain the treatment liquid, for example a lacquer or solvent, which is applied to the wafer for treatment or lacquering of the wafer. If the liquid container is empty, it must be replaced.

The attachment or detachment of the liquid container to or from the supply system may be simplified by adapters, as the adapter is pre-assembled on the liquid container and the liquid container along with the adapter can be easily coupled to the connection device of the supply system.

However, with conventional adapters and connection devices, the coupling of both components is not completely gas-tight, which leads to problems when emptying the liquid container.

Furthermore, it is not possible to align the adapter, the connection device or the liquid container such that the liquid container can be completely emptied.

The object of the invention is to provide an adapter, a connection device and a supply system eliminating the disadvantages of the prior art.

BRIEF DESCRIPTION OF THE INVENTION

According to the invention, this object is achieved by an adapter of the aforementioned type, comprising a container part for fastening to the liquid container and a channel part separate from the container part for fastening to the supply system. The container part has a central opening and a fastening device for fastening the container part to the liquid container. Furthermore, the channel part comprises a continuous first channel portion and a continuous second channel portion, the first and the second channel portion each opening into the central opening of the container part, in particular wherein a mouth area is thus formed which faces the central opening of the container part and/or projects into the central opening.

Accordingly, the invention provides a multi-part adapter by means of which a completely gas-tight coupling of the liquid container with further components of the supply system as well as a fast, simple and safe liquid container exchange may be ensured. In addition, due to its multi-part design, the adapter can contribute to a complete emptying of the liquid container.

In the context of the invention, completely gas-tight means in particular that the adapter is already gas-tightly coupled with further components of the supply system in a state in which no gas or liquid flows through the channels and therefore the adapter is not yet under pressure.

The first and second channel portions are preferably independent from each other. "Independent from each other" means that the channel portions do not extend into each other and/or do not merge into each other. In addition or alternatively, the channel portions are, at least within the channel part, not in fluid connection with each other. As a consequence, the fluids flowing within the channel part do not mix with each other at least within the channel part. Furthermore, there is no influence of the fluids onto each other, such as heat transfer.

According to an embodiment, the container part can be provided with a thread for engagement at a liquid container, the thread being for example arranged at an inner peripheral wall of the central opening. This allows achieving a gas-tight connection between the container part and the liquid container.

A seal may be provided between the container part and the channel part, which circumferentially surrounds the central opening or the mouth area of the channel portions, in particular wherein the seal is fastened to the container part or the channel part. The seal may further improve the gas-tight connection of the adapter to the liquid container.

In one embodiment, the channel part has an immersion tube, in particular a rigid immersion tube, which extends through the central opening, in particular wherein the immersion tube merges into the first channel portion. This immersion tube permits liquid from the liquid container to be led through the adapter to further components of the supply system. When fastening the adapter to the liquid container, the immersion tube is simultaneously fastened inside the liquid container. The immersion tube may be detachably or firmly connected to the channel part.

A further embodiment provides that the central opening has a central axis, wherein at least part of the first channel portion of the channel part and/or the immersion tube extends obliquely to the central axis. In this way, the channel portion and/or the immersion tube can be oriented or run obliquely to a central axis of the liquid container, so that the channel portion and/or the immersion tube can be oriented towards a lowest point in the liquid container.

It is conceivable that the first channel portion extends parallel to the central axis and the immersion tube has an oblique portion the longitudinal axis of which extends obliquely to the central axis. The immersion tube can, of course, extend completely obliquely to the central axis.

An angle between the axis of the first channel portion and the central axis and/or between the longitudinal axis of the immersion tube and the central axis can be in the range of 1° to 20°, for example 5°.

In addition, the adapter may have a fastening part comprising coupling components for fastening the adapter to the supply system. In the area of the coupling components, a coupling portion is thus formed which is, for example, part of a quick coupling formed by the coupling portion of the adapter and a supply-system-side coupling portion. The coupling components thus serve for quick, easy and safe coupling and decoupling of the liquid container to and from a connection device of the supply system.

In particular, the coupling components can project from a radially outer wall of the fastening part, e.g. in the form of projecting noses. This allows forming a quick-connection such as a Bayonet connection.

For example, the channel part, the container part and the fastening part are designed in one piece. In this way, no separate fastening elements such as screws or similar, as well as any additional seals that may be required, need to be provided.

Alternatively, the fastening part, the container part and the channel part are designed separately from each other, in particular forming a pre-assembled unit.

One aspect provides that the channel part is rotatable in the circumferential direction and/or is clamped for fastening between the container part and the fastening part. The rotatable fastening of the channel part allows the channel part to be rotated relative to the liquid container, the container part and the fastening part. For example, the channel portion and/or the immersion tube can be oriented towards the lowest point of the liquid container, in particular before the adapter is fastened to the connection part of the supply system. This allows the liquid container to be emptied completely. This is particularly advantageous for liquid containers having a rectangular cross-section.

A projection may protrude from the side of the channel part facing away from the container part, through which the second channel portion runs. The side of the channel part facing away from the container part simultaneously represents a side facing the connection part of the supply system or the supply system. The projection serves as a pin by means of which a predetermined alignment of the channel part, in particular of the entire adapter relative to the connection part, may be ensured.

In particular, the projection and the inclination of the immersion tube have a predetermined alignment to each other so that, when the adapter is inserted into the connection part, the inclination of the immersion tube with respect to the remaining supply system is defined, in particular points to the lowest point.

Furthermore, the object is achieved according to the invention by a connection device for a liquid container of a supply system of a wet process module, in particular a lacquering module, for micro- and nanofabrication for the treatment of substrates, in particular wafers. The connection device comprises the adapter according to the invention and a connection part having a liquid inlet channel and a pressure channel, wherein the first channel portion of the adapter opens into the liquid inlet channel and the second channel portion of the adapter opens into the pressure channel. A common channel is formed by the first channel portion and the liquid inlet channel and is used to take liquid from the liquid container. A common channel is formed by the second channel portion and the pressure channel and serves for the venting and/or gas supply of the liquid container.

According to one aspect, the adapter and the connection part each have a coupling portion which together form a quick coupling, in particular a bayonet mount, by means of which the adapter can be coupled to the connection part in a gas-tight manner, in particular in a detachable manner without destruction or tools.

The connection part and the adapter each have a contact side via which the connection part and the adapter rest against each other in a gastight manner in the coupled state.

An embodiment provides that the connection part has a connection base, in particular a cylindrical connection base, which comprises the liquid inlet channel and the pressure channel as well as a contact side, and a connection fastener, in particular an annular connection fastener, which surrounds the connection base circumferentially and/or is arranged on the connection base so as to be rotatable in the circumferential direction. The connection fastener therefore represents a coupling portion of the connection part. The coupling portion of the connection part can cooperate with the coupling portion of the adapter to form the quick coupling of the connection device.

For example, the connection fastener is designed as a union nut which fastens the adapter to the connection part by a rotation.

Alternatively, the connection base and the connection fastener may be in one piece. It is thus possible to save individual parts. To fasten the adapter to the connection part, the connection part is rotated relative to the adapter or vice versa.

One aspect provides that between the contact sides of the adapter, in particular of the channel part, and of the connection part, in particular of the connection base, at least one seal, in particular a ring seal, is arranged which seals a first junction of the first channel portion with the liquid inlet channel and/or a second junction of the second channel portion with the pressure channel to the outside, in particular wherein between the first junction and the second junction a further seal is arranged, which seals the junctions with respect to each other. The seal surrounds both junctions circumferentially, the seal between the two junctions surrounding only one of the junctions circumferentially. The two seals are thus spaced apart from each other in the radial direction of the connection device and/or are arranged coaxially to each other. The gas tightness of the quick coupling may be further improved by the seal(s).

It may be provided that the seal(s) is/are accommodated or attached to the connection part, in particular the connection base, or to the adapter, in particular the channel part. The seal thus remains in its intended position after decoupling the adapter from the connection part and cannot fall off the adapter or the connection part.

For example, the connection fastener of the connection part, in particular on the radially inner wall thereof, and/or the fastening part of the adapter, in particular on the radially outer wall thereof, has/have at least one coupling component, the coupling components together forming the quick coupling. For fastening, the connection fastener is pushed onto the fastening part of the adapter such that the connection fastener and the fastening part are in a common radial plane and a bayonet mount is formed by rotating the connection fastener and/or the fastening part relative to each other.

For this purpose, the coupling component of the connection fastener may for example have a radially inwardly projecting nose, and the fastening part may have a slotted guide extending in the circumferential direction opposite the nose as a coupling component, the latching nose moving along the slotted guide into its coupled or decoupled state during coupling and decoupling. Of course, the connection fastener may also have the slotted guide and the fastening part may have the nose.

The adapter is adapted to be fastened to or detached from the connection part by a rotation of the adapter and/or of the connection fastener. A simple quick-release fastener can be formed by the turn-lock fastener.

According to one aspect, the contact side of the connection part, in particular of the connection base, has an elongated hole into which the second channel portion opens. The elongated hole represents the junction of the second channel portion and the gas channel portion. The elongated hole may be designed as a blind hole, for example, and can be elongated in the circumferential direction of the connection part.

In particular, in a coupled state of the adapter with the connection part, the projection of the adapter protrudes into the elongated hole of the connection part. In this way, a predetermined alignment of the adapter and the connection part to each other may be achieved.

For example, the adapter can be connected to the connection part only with the quick coupling, i.e. the quick coupling can be closed when the projection of the adapter engages in the elongated hole of the connection part.

In particular, the elongated hole is dimensioned larger than the projection in the circumferential direction. A simple insertion of the projection into the elongated hole is thus still ensured.

In particular, the elongated hole and/or the projection may have a radius of curvature. A smooth rotation of the adapter, in particular of the channel part, and of the connection part, in particular of the connection base relative to each other can thus be ensured.

Furthermore, the object is achieved according to the invention by a supply system for a wet process module, in particular a lacquering module, for micro- and nanofabrication for the treatment of substrates, in particular wafers, which comprises a base having a support surface for placing a liquid container thereon and a connection device according to the invention, the connection device being positioned spaced apart from and opposite the support surface. The support surface is oblique to a horizontal in the intended mounting position of the supply system. Due to the oblique support surface, a bottom surface of the liquid container placed on the support surface is also oblique to the horizontal, or a longitudinal axis of the liquid container extends obliquely to a vertical. In this way, the liquid container has a lowest point or lowest area where liquid collects. The adapter or connection device according to the invention allows an immersion tube of the adapter to be oriented towards the lowest point of the liquid container, ensuring complete emptying of the liquid container.

One embodiment provides that the supply system has a working area in which the connection device is positioned for coupling to a liquid container, and a parking area in which the connection device is positioned when not in use. In the parking area, the connection device, in particular the connection part, can be easily stowed away so as to be ready to hand, for example by means of fastening means such as magnets, to facilitate the insertion and removal of the liquid container into and from the working area.

For example, the parking area may be arranged at an end, opposite the support surface, of a retaining part projecting orthogonally from the support surface, and/or the working area may be provided between the parking area and the support surface. In this way, the connection device, in particular the connection part, can be easily attached to the liquid container from the top.

In particular, the connection device, in particular the connection part, is connected to the remaining supply system in the working area only by means of lines. The connection device, in particular the connection part, can thus be moved freely in the working area, at least in the vertical direction, so that the connection device, in particular the connection part, can be easily connected to or detached from the liquid container.

The lines may have an inherent rigidity which substantially prevents a twisting and/or horizontal movement of the connection device, in particular of the connection part. This prevents an unwanted excessive rotation and ensures that the immersion tube is oriented towards the lowest point.

For example, a draining tray is arranged in the parking area, above which the connection device, in particular the connection part, is positioned when not in use, and through which any remaining liquid dripping from the connection device, in particular from the connection part, is collected.

The described advantages and features of the adapter, the connection device and the supply system according to the invention apply equally to each other.

BRIEF DESCRIPTION OF THE DRAWINGS

Further advantages and features of the invention will become apparent from the description below and from the attached drawings to which reference is made and in which.

DETAILED DESCRIPTION OF THE INVENTION

Figure 1:
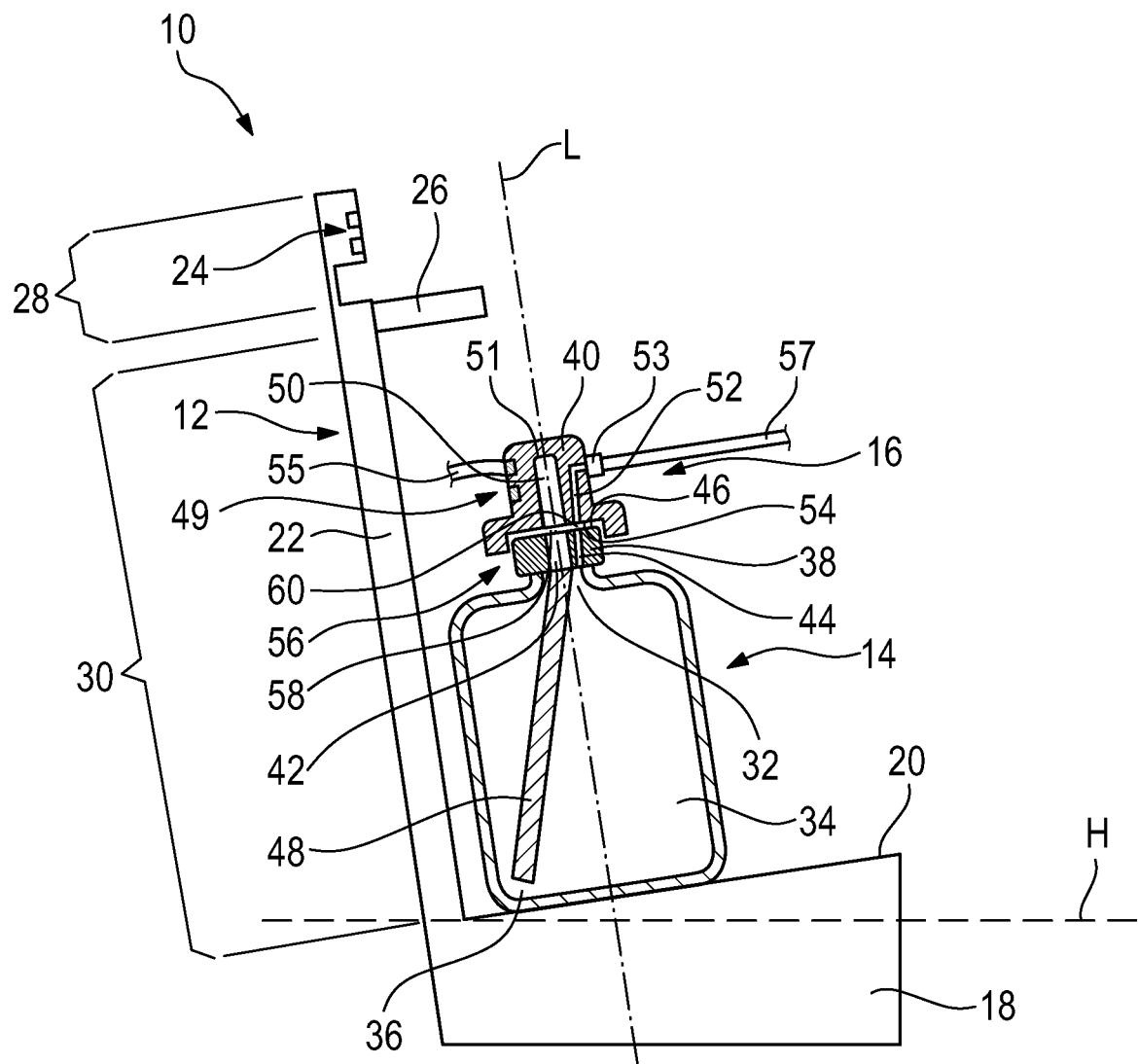
FIG. 1 shows a schematic side view of a supply system according to the invention during operation, in which a connection device according to the invention and a liquid container are shown in section.

FIG. 1 shows a supply system 10 of a wet process module, for example a lacquering module, for the treatment of substrates, for example wafers. The supply system 10 is in particular provided for a wet process module in micro- and nanofabrication.

The supply system 10 comprises a retaining device 12, in which a liquid container 14 can be accommodated, and a connection device 16, via which the liquid container 14 can be connected to the supply system 10.

The retaining device 12 includes a base 18 which has a support surface 20 and a retaining part 22 projecting substantially orthogonally from the support surface 20.

When the supply system 10 is properly installed, the support surface 20 is oblique to a horizontal H.

The retaining part 22 has fastening means 24 and a draining tray 26 at an end opposite the base 18 and the support surface 20, respectively.

The fastening means 24 are for example magnets.

The area above the draining tray 26 in which the fastening means 24 are arranged constitutes a parking area 28, and the area below the draining tray, more precisely the area between the draining tray 26 and the support surface 20, constitutes a working area 30.

The liquid container 14 contains a medium, in particular a liquid, which is used to operate the wet process module.

For example, the medium, in particular the liquid, is a lacquer, and accordingly, the liquid container 14 is a lacquer bottle.

The liquid container 14 includes an opening 32, through which an interior space 34 of the liquid container 14 is opened to the outside, and has a thread 100 on the neck.

As the liquid container 14 is placed on the inclined support surface 20, the liquid container 14 is inclined to the side so that a longitudinal axis L of the liquid container 14 extends obliquely to a vertical. A lowest point 36 in the interior space 34 where the liquid collects is thus produced.

The connection device 16 is designed in several parts and has an adapter 38 on the container side and a connection part 40 on the supply system side.

The adapter 38 is attached to, for example screwed on the liquid container 14 in the area of the opening 32 of the liquid container 14. The adapter 38 therefore closes the opening 32 in a tight, in particular gas-tight manner.

The adapter 38 has a first channel portion 42 and a second channel portion 44. The channel portions 42, 44 are continuous and each extend from a side facing the liquid container 14 to a contact side 46 facing the connection part 40. During operation, the liquid flows through the first channel portion 42, and the second channel portion 44 conducts gas. The first channel portion 42 therefore constitutes a liquid channel portion, and the second channel portion 44 constitutes a gas channel portion.

An immersion tube 48 protrudes downwards from the adapter 38 and extends through the opening 32 into the interior space 34 of the liquid container 14. The immersion tube 48 is oriented obliquely to the longitudinal axis L of the liquid container 14 so as to run towards the lowest point 36.

The immersion tube 48 adjoins the first channel portion 42 on the adapter side.

The connection part 40 has fastening means 49 on an outside or more precisely on its circumference, for example in the form of magnets.

Line connections 51, 53 are furthermore provided on the outside.

A liquid inlet channel 50 and a pressure channel 52 extend continuously from the outside of the connection part 40 to a contact side 54 opposite the contact side 46 of the adapter 38.

Towards the outside, the liquid inlet channel 50 opens into the line connection 51 and the pressure channel 52 into the line connection 53. The line connection 51 thus constitutes a liquid line connection and the line connection 53 a gas line connection.

Furthermore, several lines 55, 57 are connected to the connection part 40, wherein one line is a liquid line 55 and the other of the lines is a gas line 57, in particular a compressed gas line.

The liquid line 55 is connected to the liquid line connection 51, and the gas line 57 is connected to the gas line connection 53.

The lines 55, 57 are connected to the remaining supply system 10, e.g. the retaining device 12.

For example, the lines 55, 57 are flexible hoses that allow at least vertical movement of the connection part 40 from the parking area 28 to the working area 30 and back.

However, the lines 55, 57, in particular the line 55, has/have an inherent rigidity which limits or prevents rotation of the connection part 40.

The adapter 38 and the connection part 40 are fastened to each other in a gas-tight and detachable manner via a quick coupling 56, in particular via a bayonet mount.

The contact side 46 of the adapter 38 and the contact side 54 of the connection part 40 rest against each other in a gas-tight manner such that the first channel portion 42 and the second channel portion 44 of the adapter 38 are aligned with the liquid inlet channel 50 or the pressure channel 52 of the connection part 40, or in other words, such that the first channel portion 42 and the second channel portion 44 of the adapter 38 merge into the liquid inlet channel 50 or the pressure channel 52 of the connection part 40.

At the contact sides 46, 54, the first channel portion 42 and the liquid inlet channel 50 form a first junction 58, and the second channel portion 44 and the pressure channel 52 form a second junction 60.

Figure 2:
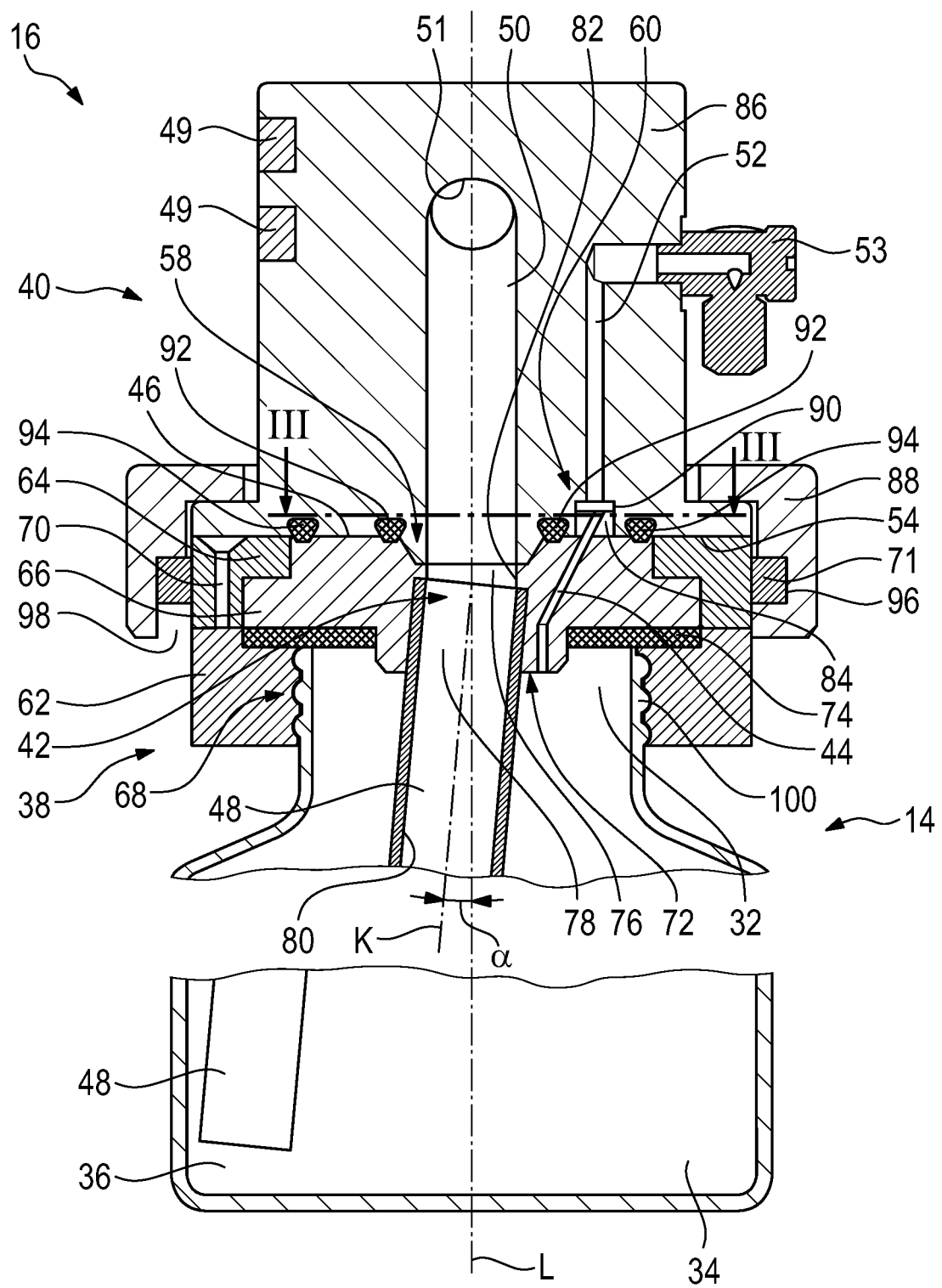
FIG. 2 shows a sectional view of the liquid container and of the connection device according to the invention of FIG. 1.
Figure 3:
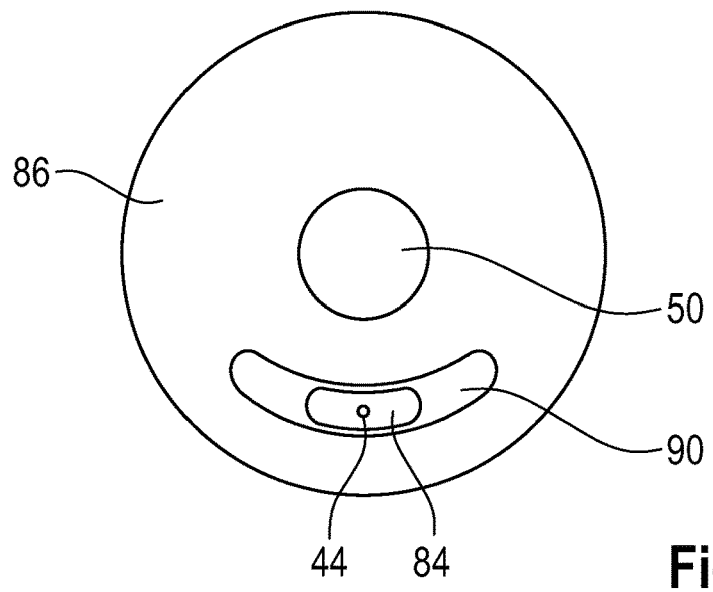
FIG. 3 shows an extremely schematic sectional view III-III of the connection device according to the invention.

FIG. 2 shows the connection device 16 in detail. The adapter 38 and the connection part 40 are each made in several parts.

The adapter 38 comprises a container part 62, a fastening part 64 and a channel part 66.

The container part 62 has a continuous, central opening 68, which has a thread on its inner peripheral wall.

The central axis of the central opening 68 corresponds substantially to the longitudinal axis L.

On the connection part side, the fastening part 64 is attached to the container part 62, for example by screws 70. Of course, the container part 62 and the fastening part 64 may also be attached to each other in a different way.

The fastening part 64 is substantially formed as a ring.

The fastening part 64 has an L-shaped profile, so that a receiving space is formed between the container part 62 and the fastening part 64.

On a radially outer wall, the fastening part 64 has several coupling components 71, which are configured as protruding noses, for example.

The channel part 66 is rotatably arranged between the container part 62 and the fastening part 64, i.e. in the receiving space. The container part 62, the fastening part 64 and the channel part 66 form a pre-assembled unit.

Alternatively, the container part 62, the fastening part 64 and the channel part 66 are configured as a one-piece component.

The channel part 66 is circumferentially surrounded by the fastening part 64 such that an upper side of the fastening part 64 and an upper side of the channel part 66 are flush or are aligned with each other, thus forming the contact side 46.

The channel part 66 and the fastening part 64 thus each form part of the contact side 46.

The first channel portion 42 and the second channel portion 44 run through the channel part 66, wherein the two channel portions 42, 44 open into a common mouth area 72. The mouth area 72 is opposite the opening 32 of the liquid container 14 and extends partly into the liquid container 14.

A seal 74 is arranged between the channel part 66 and the container part 62 and circumferentially surrounds the mouth area 72. The seal 74 constitutes, for example, a flat seal.

The seal 74 is fastened to the channel part 66 or the container part 62 and is rotatably clamped between the channel part 66 and the container part 62.

In the example embodiment shown, the first channel portion 42 has a thinner section 76 and a wider section 78, wherein the diameter of the thinner section 76 is smaller than the diameter of the wider section 78.

The wider section 78 runs obliquely to the longitudinal axis L of the liquid container 14, which simultaneously forms a longitudinal axis of the central opening 68.

An angle α between a channel axis K and/or the longitudinal axis of the immersion tube 48 on the one hand and the central axis L on the other hand is in the range of 1° to 20°. For example, the angle α is 5°. The channel axis K simultaneously constitutes a longitudinal axis of the immersion tube 48.

The immersion tube 48 is firmly or detachably received in the wider section 78 such that an inner wall 80 of the immersion tube 48 is flush with an inner wall 82 delimiting the thinner section 76.

Of course, the first channel portion 42 may also have a continuously constant diameter, so that the inner wall 80 of the immersion tube 48 is not flush with the inner wall 82 of the first channel portion 42.

Furthermore, the entire first channel portion 42 may also run obliquely to the longitudinal axis L.

Alternatively, the entire first channel portion 42 may also run parallel to the longitudinal axis L. In order to ensure that the immersion tube 48 runs at least in sections in an oblique manner, the immersion tube 48 may then have a curvature outside the first channel portion 42.

The channel part 66 has a projection 84 which extends on the contact side 46 of the channel part 66 facing away from the container part 62 in the direction of the connection part 40.

Part of the second channel portion 44 passes through this projection 84, the end of the second channel portion 44 opposite the central opening 68 opening out at the surface of the projection 84.

The connection part 40 comprises a cylindrical connection base 86 and an annular connection fastener 88.

The liquid inlet channel 50 and the pressure channel 52 extend from the respective line connection 51, 53, through the connection base 86 to the respective junctions 58, 60 on the contact side 54.

Two seals 92, 94, in particular ring seals, are arranged between the contact sides 46, 54 of the channel part 66 and the connection base 86, the seals 92, 94 being coaxial with respect to each other, and the seal 92 being provided radially on the inside and the seal 94 radially on the outside. The radially outer seal 94 circumferentially encloses the radially inner seal 92.

The radially inner seal 92 encloses the first junction 58 circumferentially, and the radially outer seal 94 encloses the first and the second junction 58, 60 circumferentially.

The second junction 60 is arranged between the radially inner seal 92 and the radially outer seal 94.

In the embodiment shown here, the two seals 92, 94 are partly accommodated and fastened in the connection base 86.

On the contact side 54, the connection base 86 has an elongated hole 90, which is configured in the form of a blind hole.

The end of the pressure channel 52 opposite to the line connection 53 opens into the elongated hole 90.

The elongated hole 90 is for example stretched in the circumferential direction and has a radius that is centered around the longitudinal axis L.

The connection fastener 88 surrounds the connection base 86 circumferentially and is rotatably attached to the connection base 86.

For example, the connection fastener 88 is designed as a kind of union nut.

On a radially inner wall, the connection fastener 88 has a coupling component 96, which is configured as a groove, for example, and defines a guideway.

The groove has several areas 98 open towards the bottom, i.e. towards the adapter 38. The number of open areas 98 corresponds to the number of coupling components 71 of the fastening part 64.

Of course, the connection fastener 88 may have the protruding noses on the radially inner wall, and the fastening part 64 may have the groove on the radially outer wall.

To put the supply system 10 into operation with a new liquid container 14, the adapter 38 along with the immersion tube 48 is attached to the liquid container 14. The immersion tube 48 is inserted into the liquid container 14, and the adapter 38 closes the opening 32 in a gastight manner. Then the liquid container 14 along with the adapter 38 is placed in the working area 30 on the support surface 20 of the retaining device 12.

To fasten the adapter 38 to the liquid container 14, the adapter 38 is screwed onto the thread 100 of the liquid container 14, the thread structure of the central opening 68 and the thread structure of the thread 100 engaging each other.

The container part 62 and the fastening part 64 are then firmly attached to the liquid container 14.

In the case of liquid containers 14 which do not have a circular area of base, the channel part 66 rotatably received between the container part 62 and the fastening part 64 allows the immersion tube 48 to be oriented so as to run to the lowest point 36.

For example, in the case of a liquid container 14 having a rectangular area of base, the immersion tube 48 can be oriented by a rotation of the channel part 66 such that the immersion tube 48 extends to an area of a corner of the area of base. The liquid container 14 can then be placed on the support surface 20 of the base 18 such that the corner of the area of base in the region of which the immersion tube 48 extends, forms the lowest point. In this case, the projection 84 should be oriented so that it is already in its final position, which it will also take up in the elongated hole 90.

In the case of a liquid container 14 having, for example, a circular area of base, it is not necessary to orientate the immersion tube 48 by a rotation of the channel part 66, as there are no points having a non-uniform, increased liquid accumulation, such as corners in the case of a rectangular area of base. Accordingly, the liquid container 14 together with the adapter 38 can be rotated so that the lowest point 36 is formed at the immersion tube 48. Nevertheless, the projection 84 should be oriented such that it is already in its final position, which it will also take up in the elongated hole 90.

For exclusively circular liquid containers, the adapter 38 may be designed as a one-piece component, as the rotatability of the channel part 66 relative to the container part 62 and the fastening part 64 is not necessary.

By orientating the immersion tube 48 in the liquid container 14 such that it always runs to the lowest point 36, a substantially complete emptying of the liquid container 14 can be ensured during the operation of the supply system 10.

To couple the adapter 38 to the connection part 40, the adapter 38 and the connection part 40 are placed with their contact sides 46, 54 against each other such that the projection 84 protrudes into the elongated hole 90.

As the projection 84 is shorter in its circumferential extension than the elongated hole 90, for example by at least one third, the projection 84 has a play in the elongated hole 90. Due to this play, the projection 84 can be inserted into the elongated hole 90, even if it is not completely exactly oriented to the elongated hole 90.

The connection fastener 88 can be slipped over the fastening part 64 only when the projection 84 engages into the elongated hole 90.

The coupling components 71, i.e. the noses, can be inserted into the coupling component 96, i.e. the guiding groove, via the areas 98 of the connection fastener 88 which are opened in sections.

By rotating the connection fastener 88 in the circumferential direction, the coupling components 96 are rotated in the circumferential direction and shifted in the radial direction over the coupling components 71, as a result of which the coupling components 71 engage in the coupling components 96 and are fastened. The coupling components 71, 96 thus form the quick coupling 56.

Due to the flexible lines 55, 57, the connection part 40 is freely movable at least in vertical direction and is placed onto the adapter 38. The adapter 38 and the connection part 40 are coupled to each other in a gas-tight manner via the quick coupling 56.

Gas under pressure is fed into the liquid container 14 via the gas line 57, the pressure channel 52 on the connection part side and the second channel portion 44 on the adapter side. Due to the resulting overpressure in the liquid container 14, the liquid in the liquid container 14 is conducted via the immersion tube 48, the first channel portion 42 on the adapter side, the liquid inlet channel 50 on the connection part side and the liquid line 55 to further components of the supply system 10, by means of which a lacquering of the substrate takes place.

Figure 4:
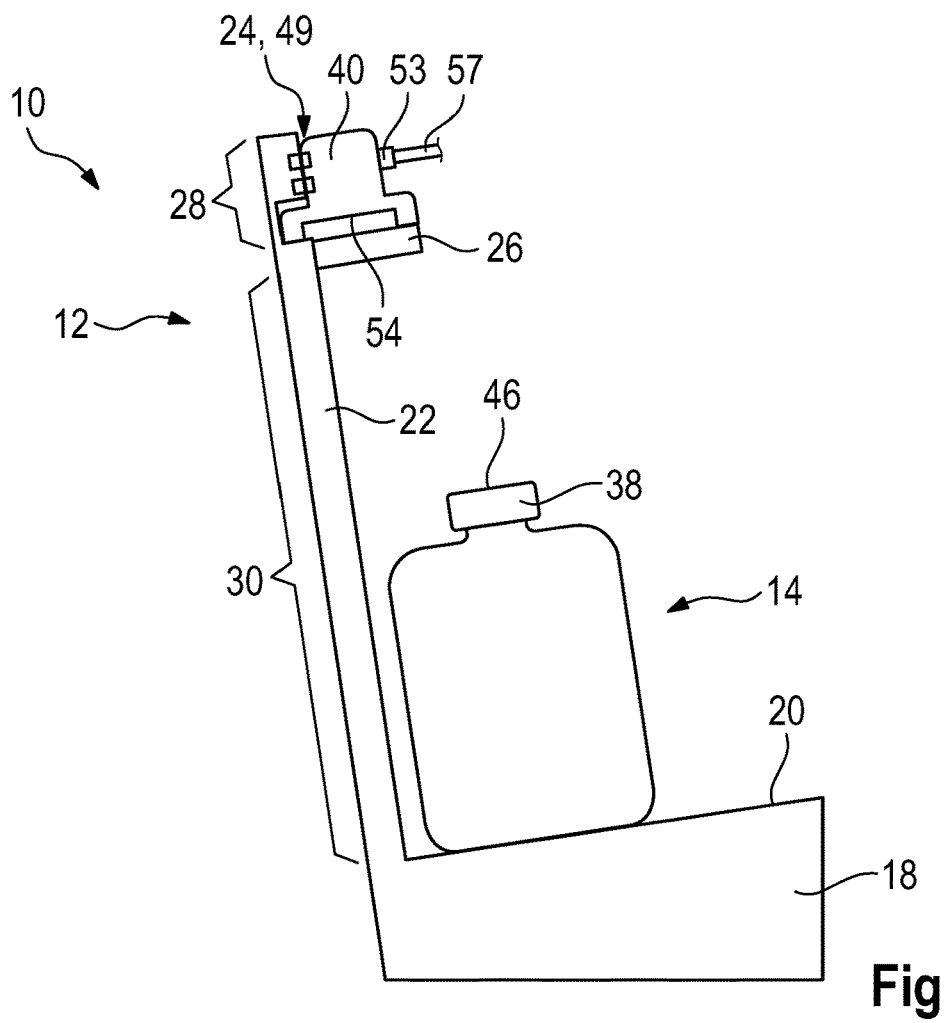
FIG. 4 shows a schematic side view of the supply system according to the invention of FIG. 1 out of operation.

When replacing the liquid container 14, the quick coupling 56 is released, and the connection part 40 is placed from the working area 30 to the parking area 28 as shown in FIG. 4. The fastening means 24, 49 of the retaining part 22 or of the connection part 40 are opposite each other, as a result of which the connection part 40 is fastened to the retaining part 22, e.g. by means of magnetic force.

The connection part 40 is placed in the parking area 28 above the draining tray 26 such that excess liquid on the connection part 40 drips into the draining tray 26.

As soon as the connection part 40 is received in the parking area 28, the liquid container 14 can be easily removed from the working area 30. Then the adapter 38 along with the immersion tube 48 can be removed from the liquid container 14 and attached to a new liquid container 14.

The invention claimed is:

1. An adapter for a liquid container of a supply system of a wet process module, for the treatment of substrates comprising
a container part configured for fastening to the container and a channel part configured for fastening to the supply system,
wherein the container part has a central opening and a fastening device configured for fastening the container part to the liquid container,
wherein the channel part comprises a continuous first channel portion and a continuous second channel portion, the first and the second channel portion each opening into the central opening of the container part, and
wherein a projection, through which the second channel portion extends, protrudes from the side of the channel part facing away from the container part.

2. The adapter of claim 1 wherein a seal is arranged between the channel part and the container part and which seal circumferentially surrounds the mouth area of the channel portions.

3. The adapter of claim 1 wherein the channel part has a immersion tube which extends through the central opening.

4. The adapter of claim 3 wherein the central opening has a central axis L, wherein at least part of at least one of the first channel portion of the channel part and the immersion tube extends obliquely to the central axis.

5. The adapter of claim 1 wherein the adapter has a fastening part comprising coupling components for fastening the adapter to the supply system.

6. The adapter of claim 5 wherein the channel part is rotatable between the container part and the fastening part in the circumferential direction and is clamped for fastening.

7. The adapter of claim 3 wherein the immersion tube is configured to merge into the first channel portion.

8. A connection device for a liquid container of a supply system of a wet process module for the treatment of substrates, comprising
an adapter for a liquid container of the supply system of the wet process module, comprising
a container part configured for fastening to the liquid container and a channel part configured for fastening to the supply system,
wherein the container part has a central opening and a fastening device configured for fastening the container part to the liquid container,
wherein the channel part comprises a continuous first channel portion and a continuous second channel portion, the first and the second channel portion each opening into the central opening of the container part, and further comprising a connection part having a liquid inlet channel and a pressure channel,
wherein the first channel portion of the adapter opens into the liquid inlet channel and the second channel portion of the adapter opens into the pressure channel,
wherein a connection fastener of the connection part and a fastening part of the adapter each have at least one coupling component for fastening the adapter,
the coupling components together forming a quick coupling, and
wherein the configured is adapted to be fastened to or detached from the connection part by a rotation of at least one of the adapter and the connection fastener.

9. The connection device of claim 8 wherein the connection part has a connection base comprising the liquid inlet channel, the pressure channel and a contact side, and a connection fastener which at least one of circumferentially surrounds the connection base and is arranged on the connection base so as to be rotatable in the circumferential direction.

10. The connection device of claim 9 wherein at least one seal is arranged between the contact sides of the adapter and of the connection part which seals at least one of a first junction of the first channel portion with the liquid inlet channel and a second junction of the second channel portion with the pressure channel to the outside.

11. The connection device of claim 9 wherein the at least one coupling component is provided on at least one of the radially inner wall of the connection fastener and on the radially outer wall of the fastening part.

12. The connection device of claim 10 wherein the at least one seal is a ring seal or the at least one seal is arranged between the contact sides of the channel part and of the connection base or wherein a further seal is arranged between the first junction and the second junction, which seals the junctions with respect to each other.

13. The connection device of claim 8 wherein a contact side of the connection base has an elongated hole into which the second channel portion opens.

14. The connection device of claim 13 wherein in a coupled state of the adapter with the connection part, a projection of the adapter protrudes into the elongated hole of the connection part.

15. A supply system for a wet process module for the treatment of substrates comprising
a base having a support surface configured for supporting a liquid container thereon, and
a connection device for the liquid container comprising an adapter for the liquid container comprising
a container part configured for fastening to the liquid container and a channel part configured for fastening to the supply system,
wherein the container part has a central opening and a fastening device configured for fastening the container part to the liquid container,
wherein the channel part comprises a continuous first channel portion and a continuous second channel portion, the first and the second channel portion each opening into the central opening of the container part,
and further comprising a connection part having a liquid inlet channel and a pressure channel,
wherein the first channel portion of the adapter opens into the liquid inlet channel and the second channel portion of the adapter opens into the pressure channel
wherein a connection fastener of the connection part and a fastening part of the adapter each have at least one coupling component configured tot fastening the adapter, the coupling components together forming a quick coupling, and wherein the adapter is adapted to be fastened to or detached from the connection part by a rotation of at least one of the adapter and the connection fastener, and wherein the connection device is positioned spaced apart from and opposite the support surface, wherein the support surface is oblique to a horizontal.

16. The supply system of claim 15 wherein the supply system comprises a working area in which the connection device is positioned for coupling to a liquid container and a parking area in which the connection device is positioned when not in use.

\* \* \* \* \*

UNITED STATES PATENT AND TRADEMARK OFFICE
CERTIFICATE OF CORRECTION

PATENT NO. : 11,776,827 B2
APPLICATION NO. : 17/388958
DATED : October 3, 2023
INVENTOR(S) : Braun et al.

Page 1 of 1

It is certified that error appears in the above-identified patent and that said Letters Patent is hereby corrected as shown below:

In the Claims

Claim 1, Column 11, Line 19, "the container" should be --the liquid container--.

Signed and Sealed this
Seventh Day of January, 2025

Derrick Brent
*Acting Director of the United States Patent and Trademark Office*